United States Patent [19]
Hosseinmardi et al.

[11] Patent Number: 5,435,446
[45] Date of Patent: Jul. 25, 1995

[54] BGA TUBE

[75] Inventors: Mohsen Hosseinmardi, San Jose; Saragarvani Pakeriasamy, Santa Clara, both of Calif.; Mokhtar Ghani, Penang, Malaysia

[73] Assignee: Advanced Micro Devices, Inc., Sunnyvale, Calif.

[21] Appl. No.: 157,543

[22] Filed: Nov. 26, 1993

[51] Int. Cl.[6] .............................................. B65D 73/02
[52] U.S. Cl. ..................................... 206/713; 206/718
[58] Field of Search ................ 206/328, 334; 361/212, 361/220

[56]  References Cited
  U.S. PATENT DOCUMENTS

| | | | |
|---|---|---|---|
| 4,592,481 | 6/1986 | Chen | 206/334 |
| 4,721,206 | 1/1988 | Votter | 206/328 |
| 4,815,594 | 3/1989 | Olson | 206/328 |
| 4,866,574 | 9/1989 | Hsiung | 206/328 |
| 4,899,876 | 2/1990 | Murphy et al. | 206/328 |
| 5,242,051 | 9/1993 | Murphy | 206/328 |

FOREIGN PATENT DOCUMENTS

| | | | |
|---|---|---|---|
| 2205585 | 8/1990 | Japan | 206/328 |
| 4201887 | 7/1992 | Japan | 206/328 |

*Primary Examiner*—David T. Fidei
*Attorney, Agent, or Firm*—Davis Chin

[57]  ABSTRACT

A BGA carrier for storing and shipping of BGA packages in a side-by-side arrangement adapted for dispensing of the same in a one-by-one fashion under gravity includes a flat elongated tubular body member (22), a lower end plug member (24), and an upper end plug member (26). The tubular body member has a first end and a second end. The tubular body member has a bore of a rectangular cross-section extending therethrough between the first end and the second end. The tubular body member includes a flat top wall portion (29), a flat bottom wall portion (30), and a pair of vertically extending side walls (32, 34) all formed integrally together. Opposed overhanging slot means (36) are formed in the pair of vertically extending side walls for supporting only two side edges of a plurality of BGA packages (12) so that top and bottom surfaces thereof are suspended freely between the top and bottom wall portions of the tubular body member. As a result, shock and potential physical damage to the BGA packages have been reduced during commercial handling and shipment.

6 Claims, 2 Drawing Sheets

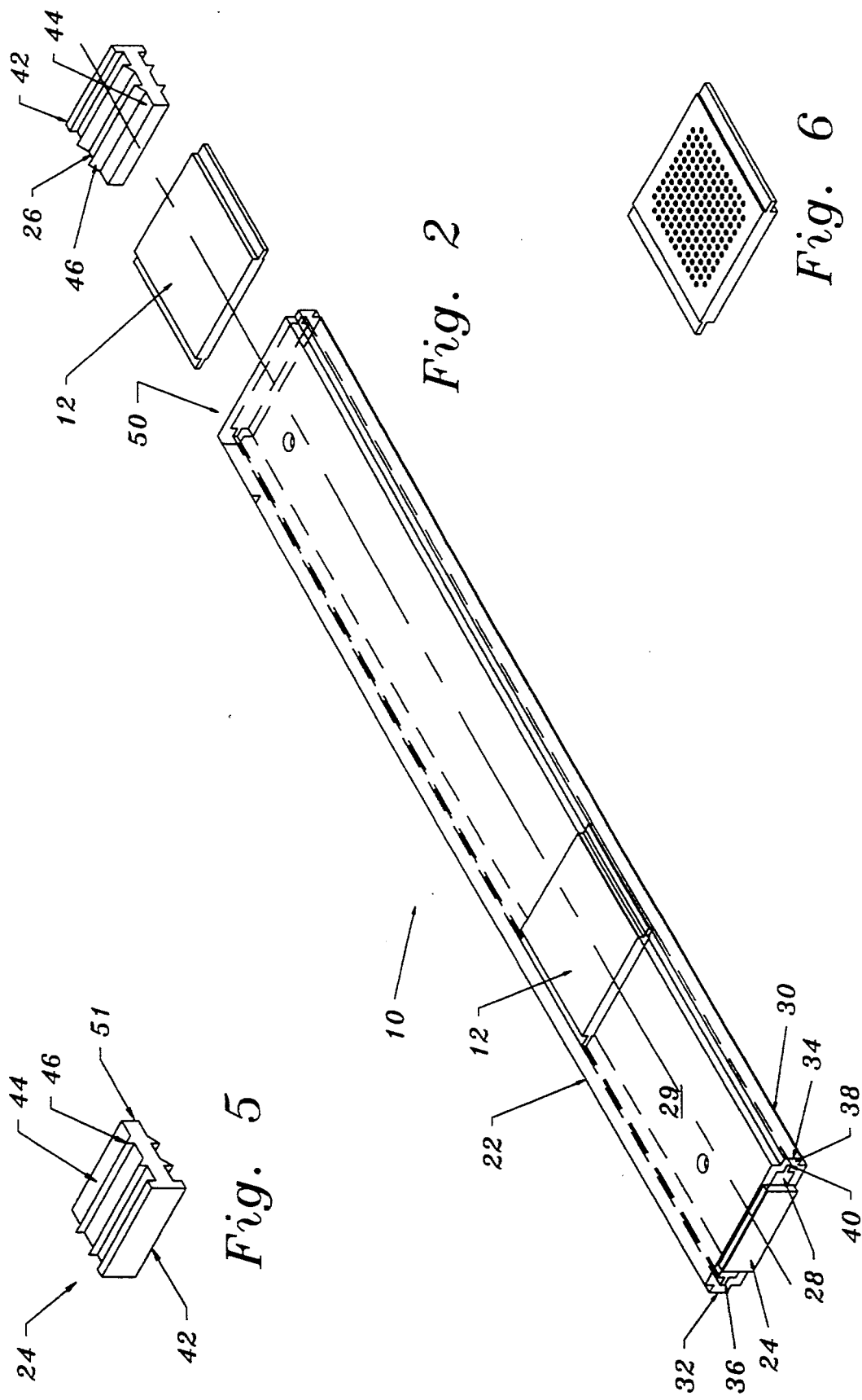

BGA TUBE

BACKGROUND OF THE INVENTION

This invention relates generally to packing devices and more particularly, it relates to a BGA carrier of a unique construction for storing and shipping of ball grid array (BGA) packages in a side-by-side arrangement and adapted for dispensing of the same in a one-by-one fashion under gravity.

In recent years, the miniaturization of integrated circuit chips has progressed significantly, and small-sized, rectangular plate-shaped parts of the type having no leads, such as pin grid array packages, have been coming into extensive use. Rome of these types of pin grid array package structures are formed with solder balls on their bottom surface rather than with external terminal pins and are referred to as "ball grid arrays" (BGA) packages. RGA packages of this type have extra-ordinarily small outer dimensions. For example, a BGA package having 165 solder balls on its bottom surface may have dimensions of about 23.0 mm (in length)×23.0 mm (in width)×2.13 mm (in thickness). It is therefore quite difficult to store and/or transport a large number of these BGA packages in a predetermined arrangement. Moreover, it is extremely time-consuming to manually mount such BGA packages one-by-one onto a printed circuit board as is done in the case of conventional larger circuit components.

As a result, there has arisen a need for chip carriers or containers for housing and/or shipping these BGA packages so as to facilitate their storage and transportation from an integrated circuit chip manufacturer's site to an assembly station at a customer's site where automatic equipment functions to remove the BGA packages from the chip carrier and to mount the BGA packages onto a printed circuit board (PCB) or the like. Further, the chip carrier may also function so as to bring different types of electrical components to the assembly station in proper order for sequential assembly operations.

In order to function properly, the chip carriers must be capable of transporting the components placed therein and then, at the proper location (i.e., customer's site) be capable of being quickly and positively opened so that the components can be easily removed for assembly purposes. In addition, the chip carrier must also be able to provide a degree of protection for the sensitive components to be transported therein with respect to contamination, electrostatic discharge (ESD), temperature changes and mechanical shock.

To date, the prior art solutions to these problems has involved the use of chip carrier trays having a plurality of separate compartments or pockets for holding the individual BGA packages apart from each other. For instance, there is shown in FIG. 1 a chip carrier tray 2 of a generally rectangular configuration. The tray 2 includes a plurality of separate compartments 4 each adapted to hold a single BGA package 6. However, these prior art trays have the disadvantage of requiring a cover that is secured to the tray and to thereby prevent the components from prematurely falling out of the compartments. Further, the cover must be opened and reclosed for quality testing or the like and causes difficulties in alignment of the cover and the tray. In addition, the use of a tray type of chip carrier requires the need of an expensive "pick and place" mechanism to perform the functions of picking up the individual BGA packages from the separate compartments of the carrier tray and placing it in position for surface mounting on a printed circuit board or some other operation.

Accordingly, the present invention provides a BGA carrier of a tubular construction for storing and shipping of BGA packages in a side-by-side arrangement and adapted for dispensing of the same in a one-by-one fashion under gravity.

SUMMARY OF THE INVENTION

It is a general object of the present invention to provide an improved BGA carrier of a tubular construction which is relatively simple and economical to manufacture and assemble, but yet overcomes the disadvantages of the prior art carrier trays.

It is an object of the present invention to provide an improved BGA carrier for storing and shipping of BGA packages in a side-by-side arrangement and adapted for dispensing of the same in a one-by-one fashion under gravity.

It is another object of the present invention to provide an improved BGA carrier for storing and shipping of BGA packages which includes means for supporting only two side edges of the BGA package so that its top and bottom surfaces thereof are suspended freely in the tube.

It is still another object of the present invention to provide an improved BGA carrier for storing and shipping of BGA packages which includes means for guiding the BGA packages through the bore in a precise alignment so as to prevent a shingling effect.

It is still another object of the present invention to provide a BGA tube which is formed of a flat top wall portion, a flat bottom wall portion, and a pair of vertically extending side walls all joined integrally together.

It is yet still another object of the present invention to provide an improved BGA carrier which is made of an inexpensive material and construction, but yet is relatively durable and re-usable.

In accordance with these aims and objectives, the present invention is concerned with the provision of an improved BGA carrier for storing and shipping of BGA packages in a side-by-side arrangement and adapted for dispensing of the same in a one-by-one fashion under gravity which includes a flat, elongated tubular body member, a lower end plug member, and an upper end plug member. The tubular body member has a first end and a second end. The tubular body member also includes a bore of a substantially rectangular cross-section extending therethrough between the first end and the second end. The tubular body member is formed of a flat top wall portion, a flat bottom wall portion, and a pair of vertically extending side walls all joined integrally together. The lower end plug member is disposed slidably and frictionally into the bore adjacent the first end of the tubular member. A plurality of BGA packages are disposed in the bore of the tubular body member to substantially fill the same. Each of the BGA packages are of a substantially rectangular shape and has side edges, a top surface, and a bottom surface.

The pair of vertically extending side walls are formed with opposing overhanging slots which are arranged in the area intermediate the top and bottom wall portions. The opposed overhanging slots are used to support two of the side edges of the BGA package so that the top and bottom surfaces thereof are suspended freely between the top and bottom wall portions of the tubular member. The upper end plug member is disposed slidably and frictionally into the bore adjacent the second end of the tubular member. As a result, shock and potential physical damage to the BGA packages during commercial handling and shipping have been reduced.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 2 is a perspective view of a BGA carrier, constructed in accordance with the principles of the present invention;

FIG. 5 is an enlarged, perspective view of one of the plug members of FIG. 2; and FIG. 6 is a perspective view of a BGA package.

DESCRIPTION OF THE PREFERRED EMBODIMENT

Figures 1, 3, 4:
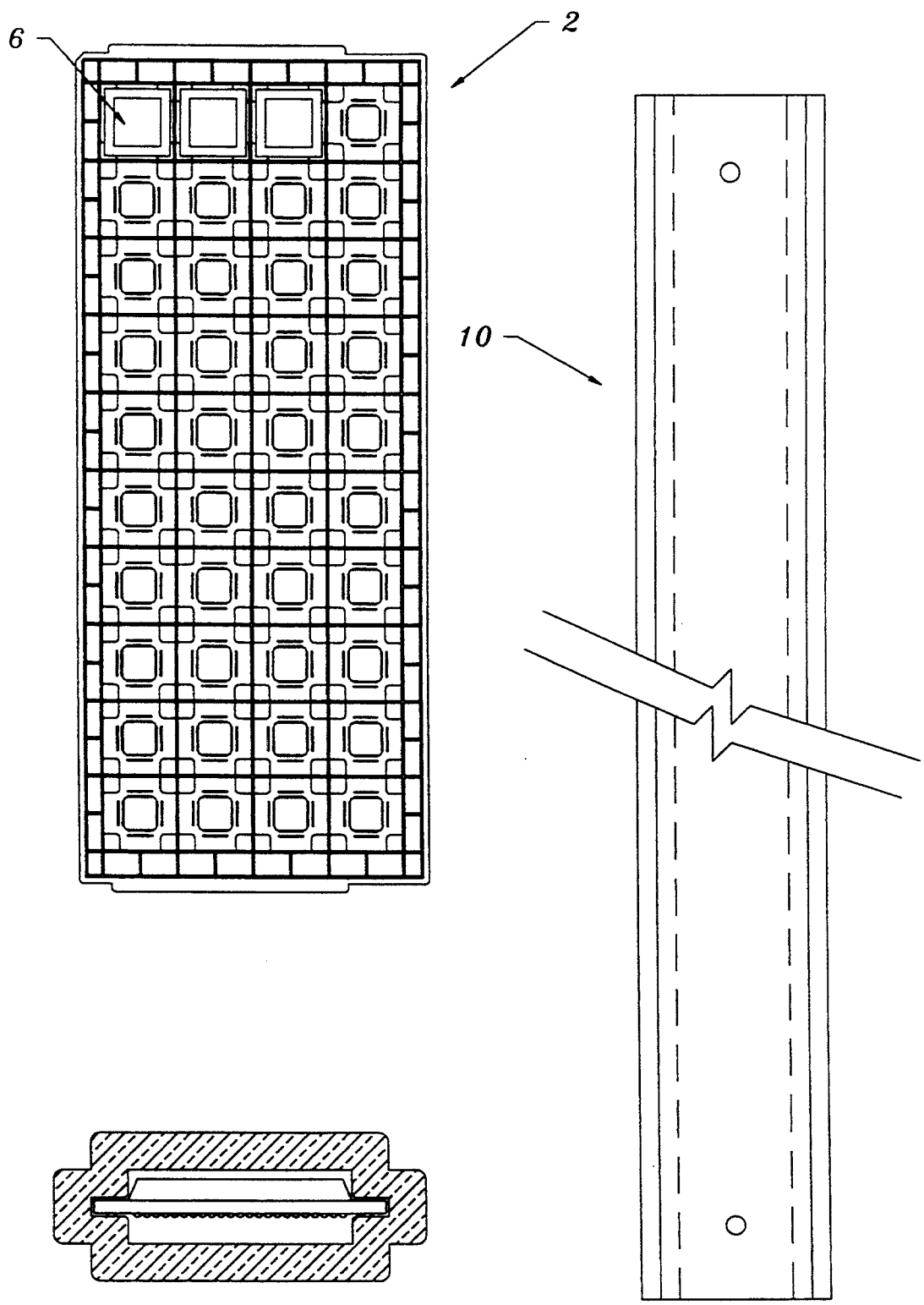
FIG. 1 is a perspective view of a chip carrier tray of the prior art.
FIG. 3 is a perspective view, similar to FIG. 2, except with the end plug members and the BGA packages being removed.
FIG. 4 is a cross-sectional view, taken along the lines 4—4 of FIG. 2.

Referring now in detail to the drawings, there is shown in FIG. 2-4 a BGA carrier designated generally by reference numeral 10 and constructed in accordance with the principles of the present invention. The BGA carrier 10 is used to store and ship a plurality of ball grid array (BGA) packages 12 in a side-by-side arrangement and adapted for dispensing of the same in a one-by-one fashion under gravity, without the need of an expensive "pick and place" mechanism (not shown). Each of the BGA packages 12 (one of which is illustrated in detail in FIG. 6) is of a substantially rectangular shape having side edges 14, a top surface 16, and a bottom surface 18. The bottom surface 18 is provided with a plurality of solder balls 20 arranged in a matrix arrangement.

The BGA carrier 10 is comprised of a flat, elongated tubular body member 22, a lower end plug member 24, and an upper end plug member 26. The tubular body member 22 has a bore 28 of a substantially rectangular cross-section extending therethrough. The tubular body member is of a single-piece construction and is preferably formed of a suitable plastic film material such as polyvinyl chloride which may be readily extruded and vacuum or pressure formed to the desired shape. In addition, it should be appreciated by those skilled in the art that the plastic material can be formulated with an appropriate additive so as to render it anti-static or static dissipative as may be required. While the body member 22 may be of various dimensions, the side walls thereof are formed so as to conform to the contour of the BGA packages and the length thereof is such that a predetermined quantity of BGA packages can be stored or housed therein, for example, twenty.

The body member includes a longitudinally extending flat top wall portion 29, a longitudinally extending flat bottom wall portion 30, and a pair of vertically extending side walls 32 and 34 all formed integrally together. In the illustrated embodiment, the top and bottom wall portions 29 and 30 have a length of approximately 508 mm and are spaced apart from each other by a distance of about 3.75 mm. Each of the side walls 32 and 34 includes an overhanging U-shaped slot 36 which is disposed in the area intermediate the top and bottom wall portions 29 and 30 and a rib-like member 38 extending outwardly from the slot 36. Each of the slots 36 define a continuous longitudinal recess which is coextensive in length with the top and bottom wall portions 29 and 30.

As can be best seen from FIG. 4, when the BGA packages are disposed in a side-by-side arrangement within the tubular member 22 only two peripheral edges of each BGA package are supported by means of the opposed overhanging slots 36 so that the top and bottom surfaces 16, 18 of the BGA package are suspended freely between the wall portions 29, 30 of the tubular member and thus the solder balls 20 do not contact or engage with any part of the tubular member. This serves to reduce the possibility of physical damage to the sensitive parts or bottom surface portions of the BGA package 12. Further, the interior surface 40 of the slots 36 are used to engage the respective side edges 14 of the BGA package and guides them through the bore 28 in a precise alignment so as to prevent the adjacent ones of the BGA packages from having a shingling effect where they tend to overlap one another. As a consequence, the BGA package can be supplied or dispensed in a uniformly smooth manner in a one-by-one fashion.

As can be seen from FIG. 5, there is shown an enlarged, perspective view of one of the end plug members 24 or 26 of FIG. 2. Since the plug members 24 and 26 are identical in their construction, it will be sufficient to describe in detail only one of them. The plug member 24 (26) has a substantially T-shaped cross-section and is formed of a horizontal platform portion 42 and a narrow vertical portion 44 joined integrally to the platform portion 42. Each of the opposing sides of the vertical portion 44 is provided with a plurality of radially extending fin-like projections or tips 46 which elastically engages the inner surfaces of the bore 28 of the tubular member 22 and which serves to prevent the plug member from falling out due to their own weight. In this manner, each end of the tubular member 22 can be opened and closed so as to facilitate loading of the BGA packages 12 during production and to permit their subsequent removal by the customers. Each of the upper and lower end plug members 24, 26 is preferably fabricated from an elastomeric material such as rubber or other polymeric material.

In use, the vertical portion 44 of the lower end plug member 24 is initially inserted into the bore 28 at the lower end or unloading (dispensing) end 48 of the tubular member 22. Then, pressure is applied to the platform portion 42 so as to cause the vertical portion 44 with its projections 46 to slide frictionally into the bore. A predetermined number of BGA packages 12 is loaded into the tubular member so as to completely fill the same, except for a small space at its upper or loading end 50. It will be noted that the distal end 51 of the vertical portion 44 of the lower end plug member 24 contacts or engages only the peripheral edge of the lowermost BGA package. Next, the upper end plug member 26 is inserted into the bore 28 at the loading end 50 of the tubular member 22 so that the distal end 52 of the vertical portion 44 thereof contacts or engages only the peripheral edge of the uppermost BGA package. Consequently, the loading end 50 of the tubular member is closed by the upper end plug member 26 so as to hold the BGA packages immovable in the tubular member 22 against undesirable free movement therein. Thus, shock and potential physical damage to the BGA packages 12 have been reduced during commercial handling and shipment.

At the customer's site, the BGA carrier 10 is adapted to be vertically positioned or placed directly in a suitable processing machine so as to remove the BGA packages 12 from the tubular member 22 and to place them onto a printed circuit board under a gravity feed. As a result, the requirement of an expensive "pick and place" mechanism to perform this function when the prior art carrier trays are used have been eliminated. Therefore, the overall assembly operation can be simplified and the manufacturing cost is thus greatly reduced. It is also an important feature of the BGA carrier that after it has been complete unloaded the empty BGA carrier can be reused since it is made of a durable material.

From the foregoing detailed description, it can thus be seen that the present invention provides an improved BGA carrier of a tubular construction for storing and shipping of BGA packages in a side-by-side arrangement and adapted for dispensing of the same in a one-by-one fashion under gravity. The BGA package of the present invention includes means for supporting only two peripheral edges of the BGA package so that its top and bottom surfaces are suspended freely between the top and bottom wall portions of a tubular member, thereby reducing the possibility of physical damage.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A BGA carrier for storing and shipping of BGA packages in a side-by-side arrangement and adapted for dispensing of the same in a one-by-one fashion under gravity, said BGA carrier comprising:

a flat, elongated tubular body member (22) having a first end and a second end;

said tubular body member having a bore of a substantially rectangular cross-section extending therethrough between said first end and said second end;

said tubular body member including a flat top wall portion, a flat bottom wall portion, and a pair of vertically extending side walls all formed integrally together;

a lower end plug member (24) disposed slidably and frictionally into the bore adjacent said first end of said tubular member;

a plurality of BGA packages (12) disposed in the bore of said tubular body member to substantially fill the same, each of said BGA packages being of a substantially rectangular shape and having side edges, a top surface, and a bottom surface;

said pair of vertically extending side walls being formed with opposed overhanging U-shaped slots (36) which are arranged in the area intermediate said top and bottom wall portions;

said opposing overhanging U-shaped slot supporting only two of said side edges of said plurality of BGA packages so that the top and bottom surfaces thereof are suspended freely between said top and bottom wall portions of said tubular member;

each of said opposed overhanging slots including an interior surface (40) which engages the respective side edges of the plurality of BGA packages and guides the same through the bore in a precise alignment so as to prevent a shingling effect;

an upper end plug member (26) disposed slidably and frictionally into the bore adjacent said second end of said tubular member;

each of said lower and upper end plug members being formed of a substantially T-shaped cross-section and including a horizontal platform portion (42) and a narrow vertical portion (44) joined integrally to said platform portion; and opposed sides of said vertical portions of said plug members being provided with radially extending fin-like projections (46) which elastically engages the inner surfaces of the bore of said tubular member.

2. A BGA carrier as claimed in claim 1, wherein said tubular body member is formed of a plastic film material.

3. A BGA carrier as claimed in claim 1, wherein said tubular body member is formed of polyvinyl chloride.

4. A BGA carrier as claimed in claim 1, wherein each of said lower and upper end plug members is formed of an elastomeric material.

5. A BGA carrier as claimed in claim 1, wherein said vertical portions of said lower plug member has a distal end (51) which engages one of the remaining side edges of the lowermost BGA package.

6. A BGA carrier as claimed in claim 5, wherein said vertical portion of said upper plug member has a distal portion (52) which engages one of the remaining side edges of the uppermost BGA package.

* * * * *

UNITED STATES PATENT AND TRADEMARK OFFICE
CERTIFICATE OF CORRECTION

PATENT NO. : 5,435,446
DATED : July 25, 1995
INVENTOR(S) : Mohsen Hosseinmardi et al.

It is certified that error appears in the above-indentified patent and that said Letters Patent is hereby corrected as shown below:

Column 1, line 15, "Rome", should be --Some--;
line 19, "RGA", should be --BGA--.

Signed and Sealed this

Tenth Day of October, 1995

BRUCE LEHMAN

*Attest:*

*Attesting Officer*  *Commissioner of Patents and Trademarks*